United States Patent [19]

Schaumburg

[11] 4,257,825
[45] Mar. 24, 1981

[54] METHOD OF MANUFACTURING SEMICONDUCTOR DEVICES HAVING IMPROVEMENTS IN DEVICE RELIABILITY BY THERMALLY TREATING SELECTIVELY IMPLANTED TEST FIGURES IN WAFERS

[75] Inventor: Hanno Schaumburg, Hamburg, Fed. Rep. of Germany

[73] Assignee: U.S. Philips Corporation, New York, N.Y.

[21] Appl. No.: 63,314

[22] Filed: Aug. 2, 1979

[30] Foreign Application Priority Data

Aug. 30, 1978 [DE] Fed. Rep. of Germany ....... 2837776
Nov. 8, 1978 [DE] Fed. Rep. of Germany ....... 2848331

[51] Int. Cl.³ .................... H01L 21/26; G01R 31/22; H01L 17/00
[52] U.S. Cl. ...................................... 148/1.5; 29/574; 250/492 A; 357/91
[58] Field of Search .................... 148/1.5; 250/492 A, 250/492 B; 357/91; 29/574

[56] References Cited

U.S. PATENT DOCUMENTS 3,723,873  3/1973  Witteles ........................... 324/158 T
3,725,148  4/1973  Kendall ................................ 148/186
4,151,008  4/1979  Kirkpatrick ........................... 148/1.5

FOREIGN PATENT DOCUMENTS 993388  5/1965  United Kingdom ..................... 148/187
1153282  5/1969  United Kingdom ................. 219/121 L

OTHER PUBLICATIONS

Dhaka et al., "Measurement . . . Sheet Resistivity", IBM-TDB, 13, (1970), 14.
Young et al., Appl. Phys. Letts., 32, (1978), 139.
Greenwald et al., "J. Appl. Phys.", 50, (Feb. 1979), 783.
Calhoun et al., "Product Simulators", IBM-TDB, 12, (1970), 1214.
Narayan et al., J. Appl. Phys., 49, (1978), 3912.
Young et al., Appl. Phys. Letts. 33, (1978), 14.
Shtyrkov et al., Sov. Phys. Semicond., 9, (1976), 1309.

*Primary Examiner*—G. Ozaki
*Assistant Examiner*—Upendra Roy
*Attorney, Agent, or Firm*—Thomas A. Briody; Robert T. Mayer; Paul R. Miller

[57] ABSTRACT

A method of manufacturing semiconductor devices in which at least one zone is formed in a number of semiconductor wafers by implantation of doping ions and by a subsequent thermal treatment. In order to reduce the costs for the thermal treatment (individual test wafers) and to reduce the spread, at least one test figure is formed in each semiconductor wafer by the implantation and is subjected to a thermal treatment after the implantation of the doping ions by means of an intensive radiation directed thereon. The electrical properties of the test figure are then measured and further thermal treatment of the whole semiconductor wafer is determined in accordance with the result of this measurement.

8 Claims, 2 Drawing Figures

METHOD OF MANUFACTURING SEMICONDUCTOR DEVICES HAVING IMPROVEMENTS IN DEVICE RELIABILITY BY THERMALLY TREATING SELECTIVELY IMPLANTED TEST FIGURES IN WAFERS

The invention relates to a method of manufacturing semiconductor devices in which at least one zone of a given conductivity type is provided in a number of semiconductor wafers by implantation of doping ions and by a subsequent thermal treatment of the whole semiconductor wafer.

In such a method in which stringent tolerance requirements are imposed upon the doping, (for example, in high-frequency transistors and capacitance diodes), the process control is important. It is endeavoured to obtain as early as possible control parameters with which the thermal treatment (to eliminate the lattice defects resulting from the implantation and to diffuse the implanted doping ions) can be influenced as efficaciously as possible.

It has so far been usual to implant semiconductor wafers of a batch (for example 30 plates) simultaneously with one wafer comprising exclusively test figures. This test wafer is then treated thermally at a comparatively low temperature of, for example, 900° C. From the sheet resistance then measured at the test figures, data are derived for the control of the thermal treatment of the batch (usually at temperatures far above 900° C.).

However, this method used so far is rather unreliable while in addition a wafer comprising only test figures is necessary for each batch, which wafers cannot be used further.

One of the objects of the invention is to carry out the method of the kind described in such manner that control parameters for the thermal treatment of the semiconductor wafers which enable a directed thermal treatment can be determined in a simple manner and without separate test wafers.

According to the invention this is achieved in that at least one test figure is formed in each semiconductor wafer by the implantation; that after the implantation of the doping ions only the test figure is subjected to a thermal treatment by means of an intensive radiation directed selectively thereon; that the electrical properties of the test figure are then measured and that the further thermal treatment of the whole semiconductor wafer is determined on the basis of the result of this measurement.

The radiation used may be both of an electromagnetic and of a corpuscular nature. According to a first preferred embodiment optical radiation originating from a laser is used. According to a further preferred embodiment an electron beam is used.

For completeness' sake it is to be noted that it is known (Appl. Phys. Letters, 32 (1978), 3, pp. 139–141) to eliminate the lattice defects in silicon doped by ion implantation by irradiation with a laser. However, the use of this process in a method of the kind described is not suggested in this article.

It is achieved inter alia by means of the method according to the invention that no separate test wafers need be used. Furthermore, the control parameters can be determined for each individual wafer so that for thermal treatment new batches each with substantially equal control parameters can be composed. As a result of this, the variation in properties between the manufactured semiconductor wafers can be considerably reduced. This is of particular importance in implantations in epitaxial layers the thickness and also the doping of which may vary rather considerably between individual wafers.

The invention will now be described in greater detail, by way of example, with reference to the accompanying drawing, in which:

FIG. 1 is a plan view of a semiconductor wafer 1 on the major surface of which several (in this case four) test FIG. 3 for measuring the sheet resistance of the semiconductor body are provided in addition to the actual semiconductor devices 2 to be manufactured (which are shown diagrammatically only).

For a given critical doping process, the whole semiconductor wafer including the test figures is subjected to doping by ion implantation.

Figure 1:
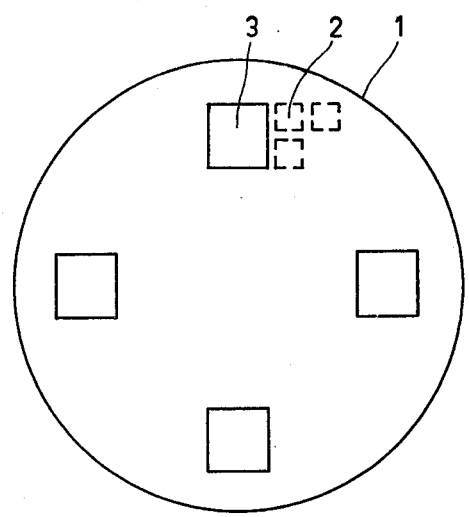
FIG. 1 is a diagrammatic plan view of a semiconductor wafer.
Figure 2:
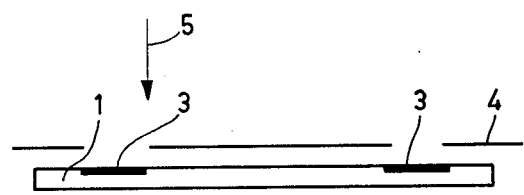
FIG. 2 is a diagrammatic cross-sectional view of the wafer shown in FIG. 1 during the performance of the method according to the invention.

As is shown diagrammatically in FIG. 2, the surface of the semiconductor wafer is then covered with a mask 4 which exposes only the test FIG. 3. The test figure(s) is (are) then heated (continuously or pulsatingly) by means of a laser radiation 5 directed thereon. The energy transferred to the test figures by the laser radiation is controlled so that partial or complete annealing of the lattice defects caused by the preceding ion implantation takes place.

After removing the mask, a sheet resistance may be measured at the test figures which resistance is determined by the preceding implantation process and the starting doping of the semiconductor wafer 1. This sheet resistance value is then used to control the thermal treatment to which the actual semiconductor devices 2 in the plate 1 are then subjected. This may be thermal treatment of the whole wafer in a furnace or a thermal treatment by means of an intensive electromagnetic or corpuscular radiation.

When treating the wafers 1 in a furnace it is efficacious to compose the individual wafers to form new batches on the basis of the measured results at the test figures.

According to a modified embodiment of the method only the test figures of the wafers 1 after the ion implantation are heated by means of an electron beam 5 directed only on the test figures by a suitable deflection system. In this case the mask 4 is superfluous. The further measurement and processing is carried out in the same manner as in the preceding example.

What is claimed is:

1. A method of manufacturing semiconductor devices in which at least one zone of a given conductivity type is provided in a number of semiconductor wafers comprising the steps of implanting doping ions into each semiconductor wafer to form at least one test figure, subjecting only said test figure to a thermal treatment by selectively directing an intensive radiation thereon, measuring electrical properties of said test figure, and carrying-out further thermal treatment of the entire semiconductor wafer as a result of said measuring step.

2. A method as claimed in claim 1, wherein said intensive radiation is optical radiation originating from a laser.

3. A method as claimed in claim 1, wherein said intensive radiation is radiation from an electron beam.

4. A method as claimed in one of claims 1, 2 or 3, wherein said intensive radiation is directed selectively on said test figure by using a mask.

5. A method as claimed in one of claims 1, 2 or 3, wherein said intensive radiation is directed as a direct beam only on said test figure in the absence of a mask.

6. A method as claimed in one of claims 1, 2, or 3, wherein after said steps of subjecting said test figure to intensive radiation and measuring said electrical properties, the semiconductor wafers are divided into groups, and each group of said wafers are subjected to the same further thermal treatment.

7. A method as claimed in claim 4, wherein after said steps of subjecting said test figure to intensive radiation and measuring said electrical properties, the semiconductor wafers are divided into groups and each group of said wafers are subjected to the same further thermal treatment.

8. A method as claimed in claim 5, wherein after said steps of subjecting said test figure to intensive radiation and measuring said electrical properties, the semiconductor wafers are divided into groups and each group of said wafers are subjected to the same further thermal treatment.

* * * * *